United States Patent [19]

Yokoyama

[11] Patent Number: 4,712,121
[45] Date of Patent: Dec. 8, 1987

[54] HIGH-SPEED SEMICONDUCTOR DEVICE
[75] Inventor: Naoki Yokoyama, Atsugi, Japan
[73] Assignee: Fujitsu Limited, Kawasaki, Japan
[21] Appl. No.: 754,416
[22] Filed: Jul. 12, 1985
[30] Foreign Application Priority Data
Aug. 30, 1984 [JP] Japan .............................. 59-179178
[51] Int. Cl.[4] .................. H01L 27/12; H01L 29/161; H01L 29/72
[52] U.S. Cl. ......................................... 357/4; 357/16; 357/34
[58] Field of Search ...................... 357/16, 4, 4 SL, 34
[56] References Cited

U.S. PATENT DOCUMENTS 4,616,241 10/1986 Biefeld ................................. 357/16

FOREIGN PATENT DOCUMENTS

| 0068064 | 1/1983 | European Pat. Off. .......... 357/4 SL |
| 0142574 | 8/1983 | Japan ................................. 357/4 SL |
| 60-175450 | 2/1984 | Japan ..................................... 357/16 |
| 0090978 | 5/1984 | Japan ..................................... 357/57 |

Primary Examiner—Martin H. Edlow
Assistant Examiner—Don Featherstone
Attorney, Agent, or Firm—Staas & Halsey

[57] ABSTRACT

A high-speed semiconductor device including an emitter layer a base layer a collector layer, a potential-barrier layer disposed between the base layer and the collector layer, and a superlattice disposed between the emitter layer and the base layer. The superlattice has at least one quantum well therein and has a low impedance state for tunneling carriers therethrough. Preferably, the high-speed semiconductor device may further include a graded layer disposed between the emitter layer and the superlattice. The graded layer has a conduction-energy level which is approximately equal to that of the emitter layer at the interface of the graded layer and the emitter layer and approximately equal to a predetermined conduction-energy level of the superlattice at the interface of the graded layer and the superlattice. In addition, the high-speed semiconductor device may act as a frequency multiplier, providing an output signal having $2^n$ times a many frequencies as an input signal when n is the number of quantum wells in said superlattice.

12 Claims, 25 Drawing Figures

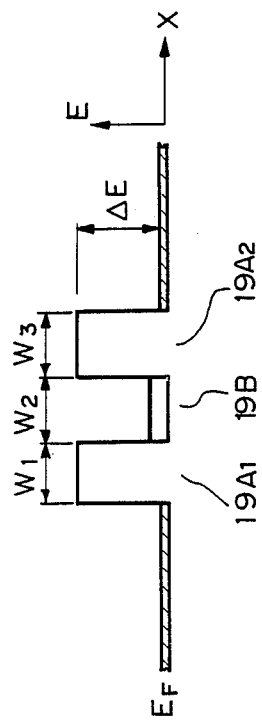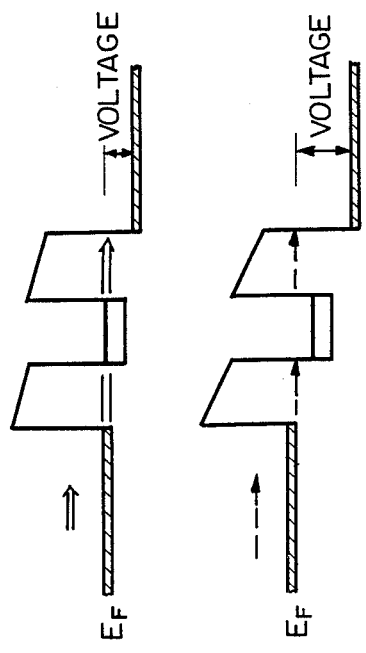
Fig. 14a
Fig. 14b
Fig. 14c

HIGH-SPEED SEMICONDUCTOR DEVICE

BACKGROUND OF THE INVENTION

1. Field of the Invention

The present invention relates to a high-speed semiconductor device, more particularly to a hot electron transistor (HET) device which includes a heterojunction emitter, base, collector, and a superlattice means between the emitter and the base.

2. Description of the Related Art

The principle of an HET has long been known (C. A. Mead, Proc. IRE48, 359, 1961). This old HET, however, was structured by stacked metal and oxide layers, and thus could not be applied to actual semiconductor devices.

Recently, due to advances in semiconductor processing technology, such as molecular beam epitaxy (MBE) and metal organic chemical vapor deposition (MOCVD), new HET's having, for example, n-type galliumarsenic (GaAs) layers instead of the above metal layers and aluminum-gallium-arsenic (AlGaAs) layers instead of the above oxide layers have been developed (see, e.g., "Characterization of Double Heterojunction GaAs/AlGaAs Hot Electron Transistors", N. Yokoyama, et al. PROCEEDINGS OF THE IEEE INTERNATIONAL ELECTRON DEVICES MEETING, Dec. 1984, pp 532 to 535).

These newer HETs, however, suffer from low current amplification.

SUMMARY OF THE INVENTION

It is an object of the present invention to provide a high-speed semiconductor device with improved transistor current amplification.

It is another object of the present invention to provide a high-speed semiconductor device outputting a multiplied frequency signal for a single input pulse signal.

According to the present invention, there is provided a high-speed semiconductor device including: an emitter layer; a base layer; a collector layer; a potential-barrier layer disposed between the base layer and the collector layer; and a superlattice disposed between the emitter layer and the base layer and formed with at least one quantum well therein and having a low impedance state for tunneling carriers therethrough. The superlattice includes at least one set of quantum-well forming layer regions having thin potential barrier layers and a thin quantum-well layer between the potential barrier layers, which are formed with a heterojunction structure, and defines the quantum well and the low impedance state. The superlattice may include a plurality of sets of quantum-well forming layer regions which are stack-formed with a periodical structure and has at least one conduction mini-energy band for tunneling the carriers therethrough.

Preferably, the high-speed semiconductor device may further include a graded layer disposed between the emitter layer and the superlattice and having a conduction-energy level which is approximately equal to that of the emitter layer at one end and is also approximately equal to a predetermined conduction-energy level of the superlattice at another end, for allowing tunneling of the carriers therethrough. The carriers in the emitter layer are transported along the graded conduction-energy level in the graded layer, tunneled through the superlattice with the predetermined conduction-energy level and injected into the base layer.

In addition, the high-speed semiconductor device may be given a predetermined DC bias for a resonant tunneling phenomenon of the carriers at the superlattice, and thus may output a signal having a $2^n$ multiplied frequency when an input pulse signal having a predetermined voltage range and predetermined slopes is supplied to the base layer.

BRIEF DESCRIPTION OF THE DRAWINGS

Other objections and features of the present invention will be described below in detail with reference to the accompanying drawings, in which:

FIG. 14a to 14c are diagrams for explaining a resonant tunneling phenomenon at a superlattice in the HET device in FIG. 13;

DESCRIPTION OF THE PREFERRED EMBODIMENTS

Before describing preferred embodiments of the present invention, an explanation will be given of the prior art for reference.

Figure 1:
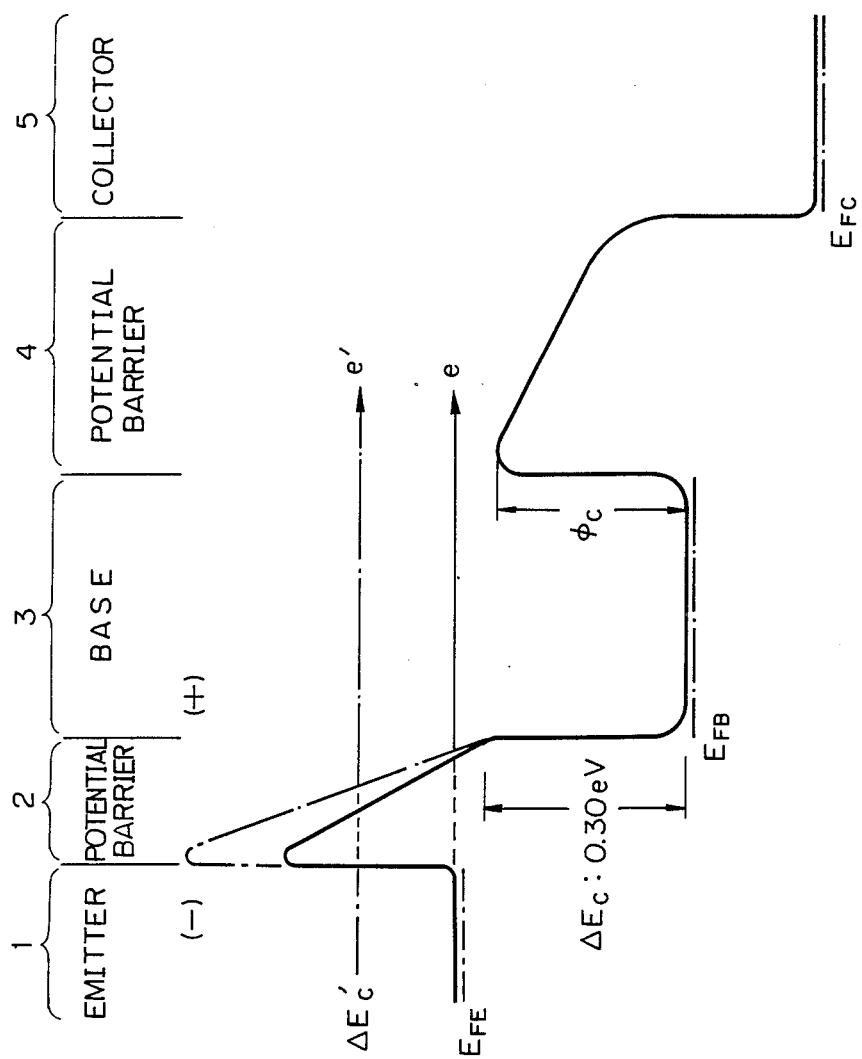
FIG. 1 is a conduction-energy-band diagram for a prior art HET device.

FIG. 1 is a conduction-energy-band diagram for a prior art HET device.

In FIG. 1, reference $E_{FE}$ represents a pseudo-Fermi level of at an n-type GaAs emitter layer 1, $E_{FB}$ a pseudoFermi level of an n-type GaAs base layer 3, $E_{FC}$ a pseudo-Fermi level of an n-type GaAs collector layer 5, e a hot electron tunneling through an emitter-side non- doped AlGaAs potential barrier layer 2, $\Delta E_C$ a conduction-band energy difference between the energy level of the barrier layer 2 and the energy level of the base 3, and $\phi_c$ a conduction-band discontinuity.

Between the base 3 and the collector 5, there is provided a non-doped impurity AlGaAs potential barrier 4.

In the above HET, when a DC bias is applied between the collector layer 5 and the emitter layer 1, and a positive voltage is supplied to the base layer 3 as shown in FIG. 1, the gradient of energy barrier at the potential barrier layer 2 is changed, resulting in a thin energy barrier. Consequently, electrons injected from the emitter layer 1 may be tunneled (passed) through the potential barrier layer 2 to inject into the base layer 3. The potential energy of the hot electrons injected into the base layer 3 may be changed to kinetic energy due to $\Delta E$. As a result, the electrons injected into the base layer 3 become high-speed hot electrons. High-speed hot electrons having an energy level greater than $\phi_c$ at the potential barrier layer 4 can be injected into the collector layer 5 over $\phi_c$ at the potential barrier layer 4, in principle, without scattering.

Figure 2:
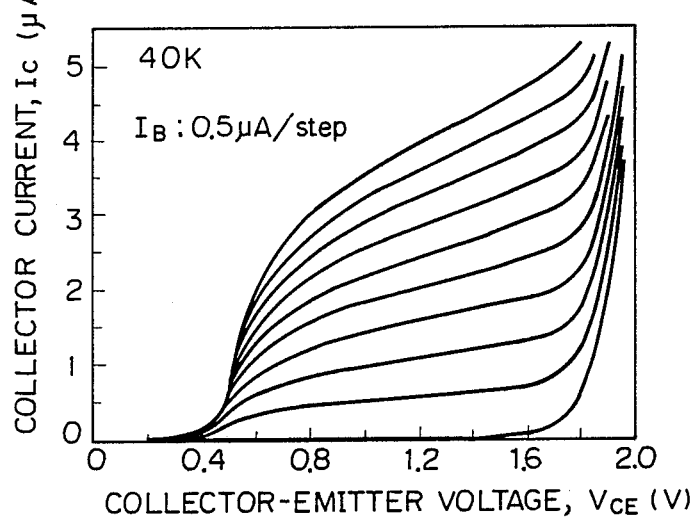
FIG. 2 is a graph of the collector current $I_C$ and collector-emitter voltage $V_{CE}$ characteristics for the prior art HET device.

However, when the energy level of the electrons in the emitter layer 1 is low, the number of the electrons injected into the base layer 3 is low due to the considerably thick barrier wall at the potential barrier layer 2, resulting in a low collector current $I_C$ of the transistor, as shown in FIG. 2 FIG. 2 represents the collector current $I_C$ and collector-emitter voltage $V_{CE}$ characteristics of the prior art HET device.

In order to increase the number of the electrons injected from the emitter layer 1 into the base layer, 3 and accordingly to increase a current amplification factor $\alpha$ of the transistor, the application of a higher voltage between the base layer e and the emitter layer 1 is required. If a voltage higher than that mentioned above is supplied between the base layer 3 and the emitter layer 1, the gradient of the barrier at the potential barrier layer 2 is changed as shown by the dashed line in FIG. 1 and the energy level of the electrons is increased to $\Delta E_C'$ as shown in FIG. 1. As a result, the number of the electrons injected into the base layer 3 should be increased in principle.

Figure 3:
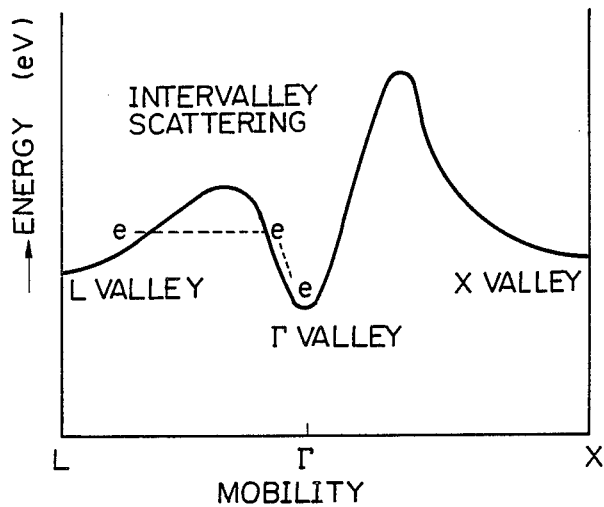
FIG. 3 is a graph of the conduction-energy-band structure of GaAs.

However, the energy-band structure of GaAs must be conisdered. FIG. 3 is a graph of an example of the conduction-energy-band structure of GaAs (See "Physics of Semiconductor Devices" Second Edition, by S. M. Sze, John Wiley & Sons, p 13). The energy-band structure includes an L-valley, a Γ-valley, and an X-valley. When an electron is at the Γ-valley, the effective mass thereof is small and the mobility thereof is high. On the other hand, when the electron is at the X-valley or L-valley, the effective mass thereof is large and the mobility thereof is low. If the energy level of the electrons at the Γ-valley is lifted, as shown in FIG. 3, the electrons can be affected by inter-valley scattering, that is, the electrons in the Γ-valley can be transferred to the L- or X-valley by phonons. Due to the inter-valley scattering, the electrons injected into the base layer 3 and having a high-energy level can be scattered in a variety of directions, decreasing the number of electrons reaching the collector layer 5. Accordingly, the benefit of increasing the voltage between the emitter layer 1 and the base layer 3 cannot be obtained.

In the prior art HET device mentioned above, the current amplification factor $\alpha$ at 77° K. is, for example, approximately 0.5 when the base layer is grounded and approximately 1 when the emitter layer is grounded.

Preferred embodiments of the present invention will now be explained.

Figure 4:
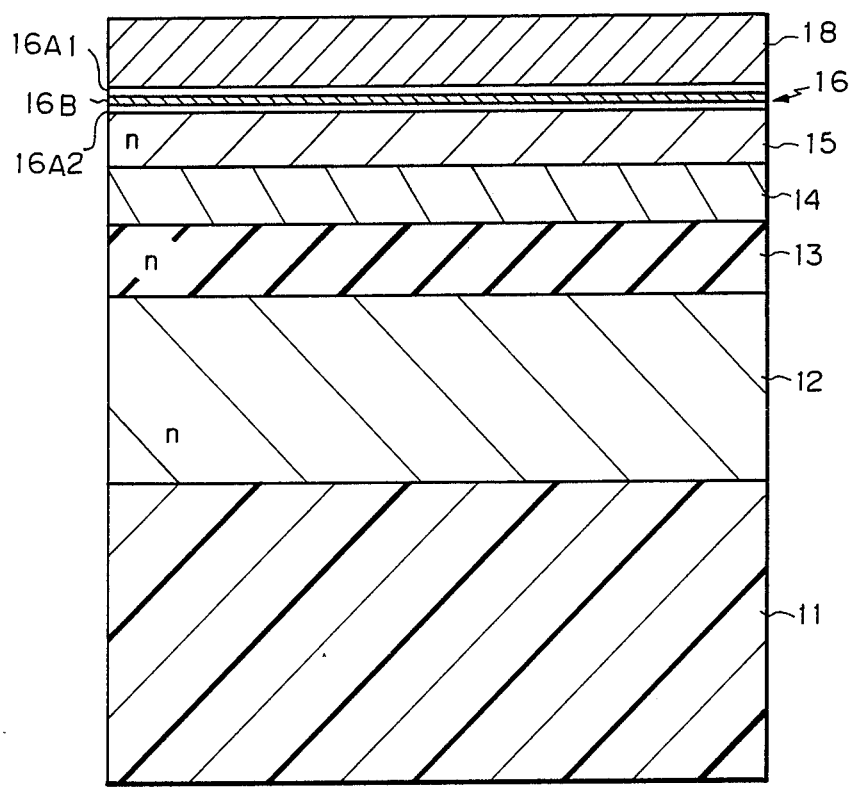
FIG. 4 is a sectional view of a semifinished HET device according to an embodiment of the present invention.

A first embodiment of a HET device according to the present invention will be explained referring to FIGS. 4 to 6. FIG. 4 is a sectional view of a semifinished HET device which comprises semi-insulating GaAs substrate 11, an n-type GaAs collector contact layer 12, an n-type GaAs collector layer 13, a non-doped impurity $Al_{0.3}Ga_{0.7}As$ collectorside potential barrier layer 14, an n-type GaAs base layer 15, a superlattice, i.e., emitter-side potential barrier layer 16, and an n+-type GaAs emitter layer 18.

The superlattice 16 comprises non-doped impurity AlAs layers 16A1 and 16A2 and a non-doped impurity GaAs layer 16B formed between the non-doped impurity AlAs layers 16A1 and 16A2 are disposed between the emitter layer 18 and the base layer 15, instead of the non-doped impurity AlGaAs potential barrier layer 2 in the prior art mentioned above.

The above construction of the HET device is formed by the MBE process.

The following parameters apply for the layers of the HET device shown in FIG. 4, where d represents an impurity density and t a layer thickness;

A. n-type GaAs collector-contact layer 12
  d: $2 \times 10^{18}$ cm$^{-3}$ ($2 \times 10^{24}$ m$^{-3}$)
  t: 5000 Å (500 nm)
B. n-type GaAs collector layer 13
  d: $5 \times 10^{17}$ cm$^{-3}$ ($5 \times 10^{23}$ m$^{-3}$)
  t: 2000 Å (200 nm)
C. n-type base layer 15
  d: $5 \times 10^{17}$ cm$^{-3}$ ($5 \times 10 \leqq$ m$^{-3}$)
  t: 1000 Å (100 nm)
D. AlAs layers 16A1, 16A2
  t: 30 Å (3 nm)
E. GaAs layer 16B
  t: 30 Å (3 nm)
F. n+-type GaAs emitter layer 18
  d: $2 \times 10^{18}$ cm$^{-3}$ ($2 \times 10^{24}$ m$^{-3}$)
  t: 5000 Å (500 nm)

Figure 5:
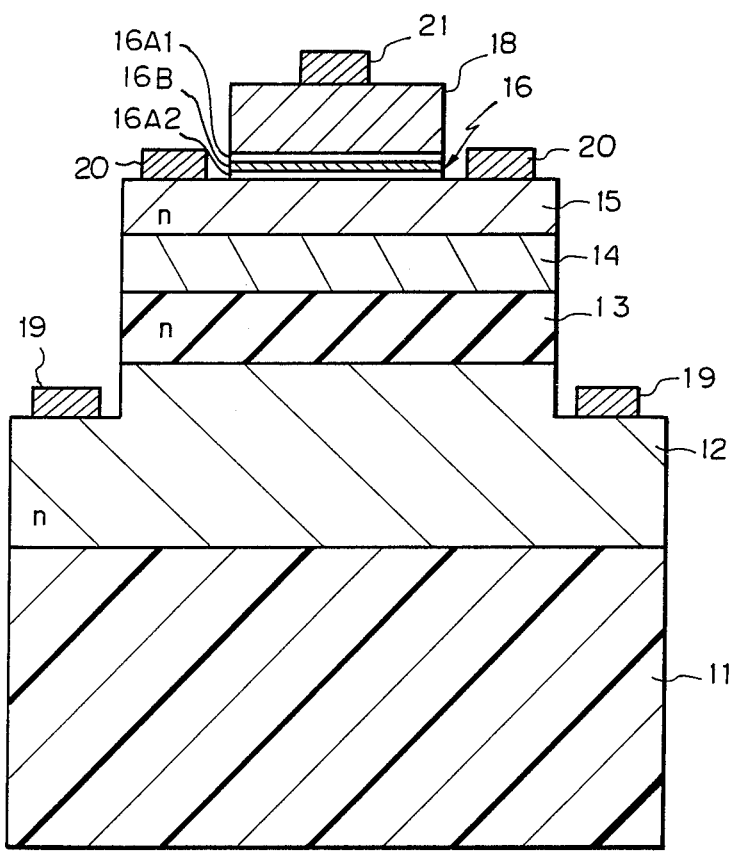
FIG. 5 is a sectional view of the HET device shown in FIG. 4.

FIG. 5 is a sectional view of a completed version of the HET device shown in FIG. 4.

The HET device in FIG. 5 is formed from the semifinished HET device as shown in FIG. 4 by the following processes:

A. Mesa-etching is performed by a normal photolithography process on the top of the HET device until the n-type GaAs collector-contact layer 12 is exposed.

B. Mesa-etching is again performed by a normal photolithography process on the top of the HET device until the n-type GaAs base layer 15 is exposed.

C. Gold (Au).Germanium (Ge)/Au films are formed by a vapor deposition process on the above exposed portions. In addition, patterning is effected by a normal photolithography process on the above Au.Ge/Au films, resulting in the formation of collector electrodes 19, base electrodes 20, and an emitter electrode 21.

Figure 6:
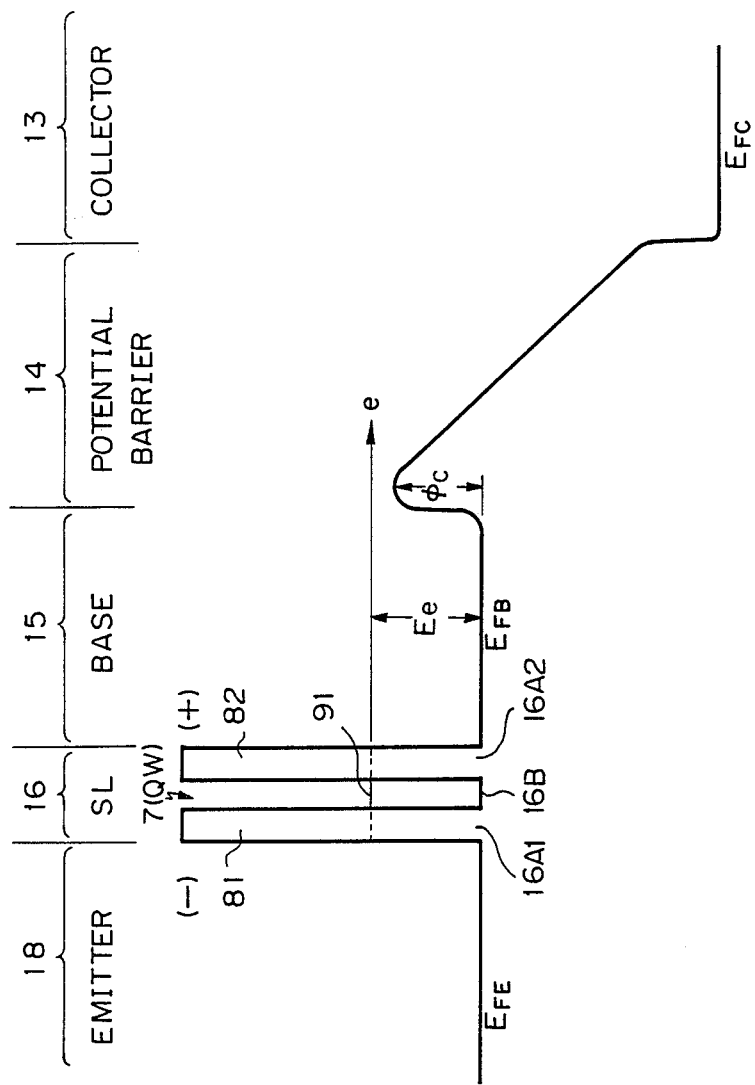
FIG. 6 is a conduction-energy-band diagram for the HET device shown in FIG. 5.

FIG. 6 is a conduction-energy-band diagram for the HET device shown in FIG. 5.

In the superlattice 16, a so-called GaAs quantum well (QW) 7 is formed. By forming the heterojunction layer of the extra-thin non-doped impurity AlAs layers 16A1 and 16A2 and the extra-thin non-doped impurity GaAs layer 16B between them, the motion of the electrons which move in a direction perpendicular to the heterojunction surface is quantized, with a resultant formation of the quantum well 7. The thickness of the above layers 16A1, 16A2, 16B can be 10 Å to 100 Å, and is preferably 30 Å to 50 Å.

Incidentally "superlattice" has various definitions. In this specification, "superlattice" is defined as a layer (or region) having at least one quantum well therein By applying voltage having polarities as shown in FIG. 6 between the emitter layer 18 and the base layer 15, the electrons in the emitter layer 18 are tunneled through the first thin potential barrier wall 81, whereby the electrons reach the quantum well region. Electrons having an energy level equal to a sub-band 91 are further tunneled through the second thin potential barrier wall 82. As a result, the hot electrons e are injected into the base layer 15.

The sub-band 91 defines an energy level Ee of the hot electrons in the base layer 15. In the quantum well 7, there may be a plurality of discrete sub-bands. Each sub-band provides a low impedance state, because the sub-band may trap electrons having an energy equal to the sub-band, which are injected into the base layer 15 tunneling through the second thin barrier layer 16A2. In the embodiment, consideration is given to a sub-band with an energy level higher than the conductionband discontinuity $\phi_c$ and with a level as low as possible in order to avoid inter-valley scattering.

The above energy level Ee of the hot electrons e, i.e., the sub-band 91, may be selectively defined by selecting the thickness of the heterojunction layers 16A1, 16B, and 16A2 in the superlattice 16. Note that electrons having the above energy level Ee are not affected by the voltage level applied between the emitter layer 18 and the base layer 15. Accordingly, the hot electrons e injected into the base layer 15 are ballistically transported to the collector layer 13 with a high speed and without intervalley scattering. In other words, the current amplification factor $\alpha$ is increased due to the increase of arrival of hog electrons to the collector layer 13.

Figure 7:
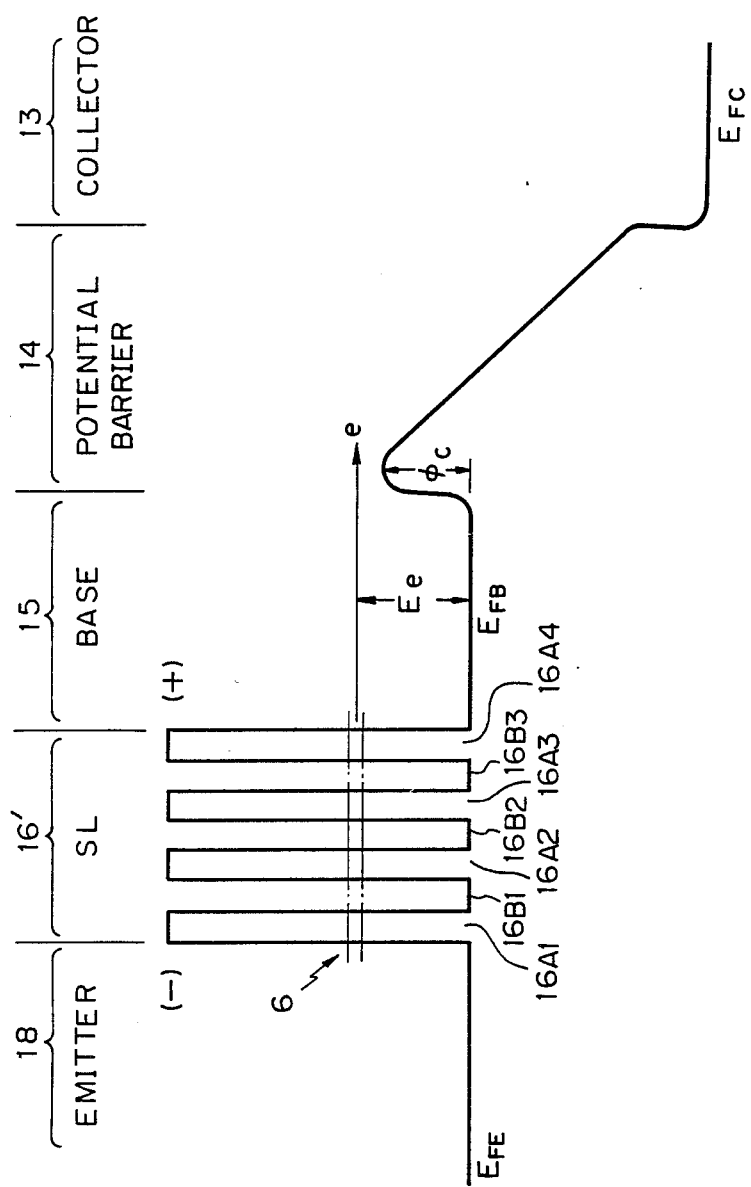
FIG. 7 is a conduction-energy-band diagram for another embodiment of an HET device in accordance with the present invention.

FIG. 7 is a conduction-energy-band diagram of another embodiment of an HET device in accordance with the present invention. The HET device having the characteristics shown in FIG. 7 includes a superlattice 16', which comprises of non-doped impurity AlAs 16A1 to 16A4 and non-doped impurity GaAs layers 16B1 to 16B2, each of which has a thickness of 30 Å (3 nm) as mentioned above. That is, the superlattice 16' has a periodical structure of alternatively stacked AlAs layers 16A, which can capture the electrons therein, and GaAs layers 16B, which allow tunneling of the electrons therethrough. In the above heterojunction multilayer superlattice structure, the bond of adjacent quantum wells may be increased, resulting in formation of a mini-energy band 6.

Figure 8:
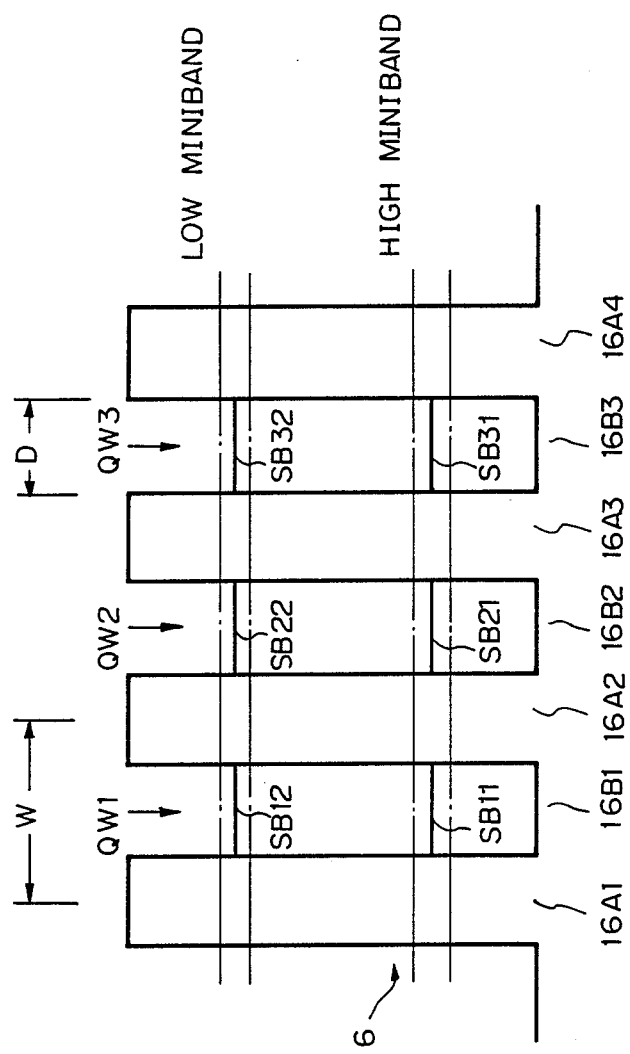
FIG. 8 is a graph for explaining the formation of a mini-energy band at a superlattice in FIG. 7.

Formation of the mini-energy band 6 will be explained in brief referring to FIG. 8. When only one quantum well exists in the superlattice as mentioned above or when they are separate quantum wells, each sub-band (SB11 to SB31) quantum level is degenerated. In the above periodical structure, the thickness of the AlAs layers 16A2 and 16A3 between the GaAs layers 16B1, 16B2, and 16B3 formed with quantum wells QW1 to QW3 therein is extremely thin, and the decrease of electron waves in the AlAs layers 16A2 and 16A3 is not sufficient. As a result, there is an increase of the bond of the quantum levels between adjacent GaAs layers. Consequently, the degenerated quantum levels in each sub-band are separated into a plurality of quantum levels forming the mini-energy band 6. As a result, the electrons may be propagated through the mini-energy band 6, which has an energy band width greater than that of the sub-band.

The function of the mini-energy band 6 is similar to that of the sub-band 91. However, the mini-energy band 6 enables an increase in the number of electrons passing through the superlattice 16' with respect to number of electrons passed with the the sub-band 91. The other layers 13, 14, 15, and 18 or the device described with reference to Figs. 7 and 8 are identical to those in FIGS. 4, 5, and 6.

According to the HET device shown in FIG. 7, at a temperature 77° K., a current amplification factor $\alpha$ of 0.75 is obtained when the base layer is an amplification factor a of 3 is obtained when the emitter is grounded.

Figure 9:
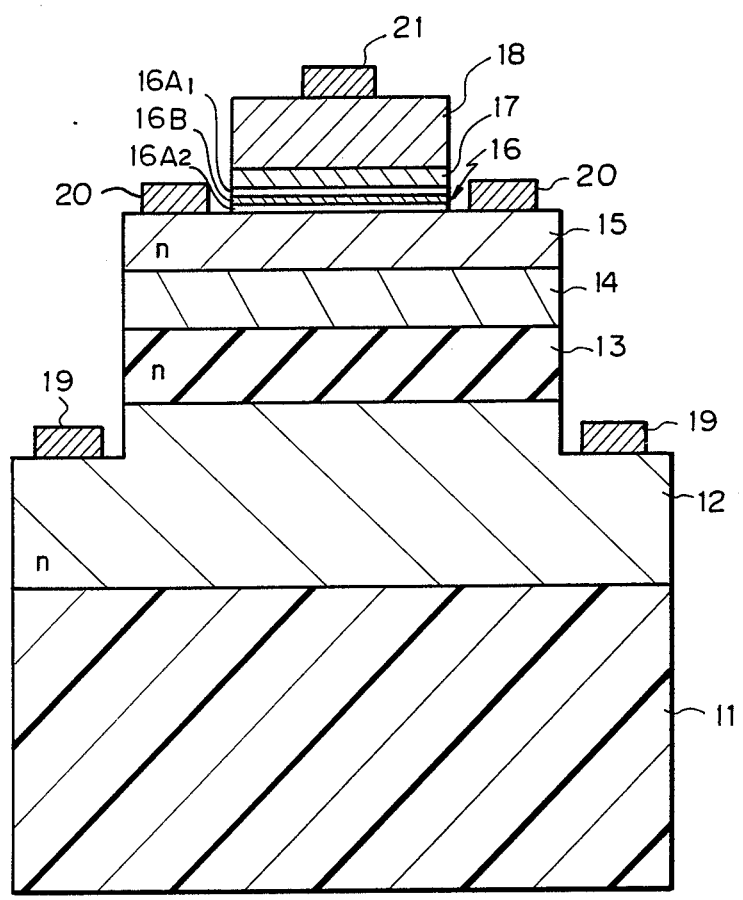
FIG. 9 is a sectional view of still another embodiment of an HET device in accordance with the present invention.
Figure 10:
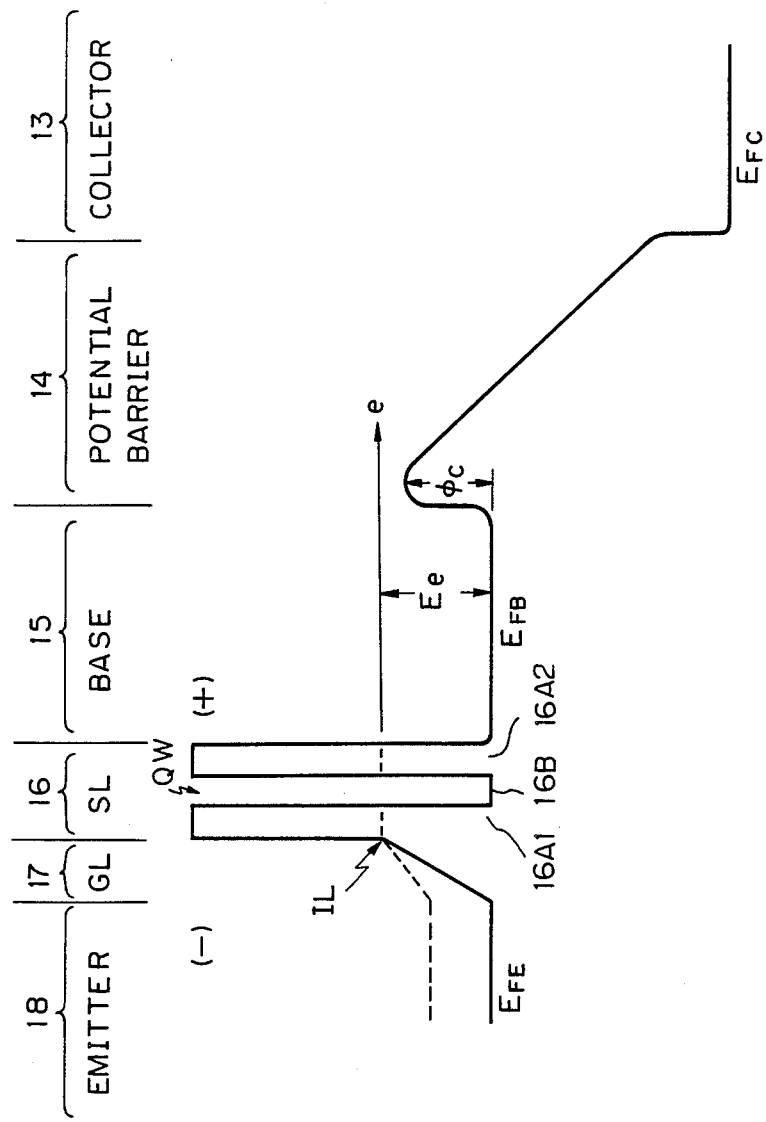
FIG. 10 is a conduction-energy-band diagram for the HET device shown in FIG. 9.

Referring to FIGS. 9 and 10, another embodiment of an HET device according to the present invention will be explained.

The HET device shown in FIG. 9 further includes a nondoped impurity $Al_xGa_{1-x}As$ graded layer 17, the suffix x designating the composition rate, provided between the emitter layer 18 and the superlattice 16 in addition to the layers comprising the HET device shown in FIG. 5. The parameters of the graded layer 17 are as follows:

Thickness: 100 Å (10 nm)
Composition rate x: 0.3 to 0.0

By provision of the graded layer 17 between the emitter layer 18 and the superlattice 16, the conduction energy bands of the pseudo-Fermi level $E_{FE}$ at the emitter layer 18 and the sub-band 91 in the superlattice 16 are joined with a gradient. As a result, the electrons in the emitter layer 18 may easily and surely reach an injection level IL of the superlattice 16, shown in FIG. 10, which is equal to the sub-band, along the graded energy level.

Figure 11:
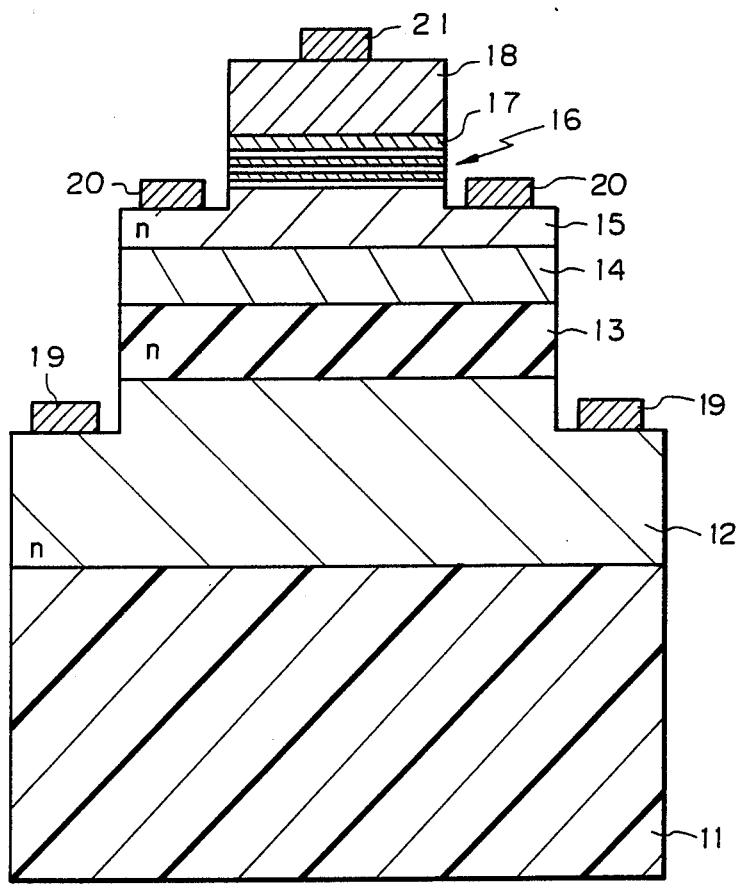
FIG. 11 is a sectional view of a further embodiment of an HET device in accordance with the present invention.
Figure 12:
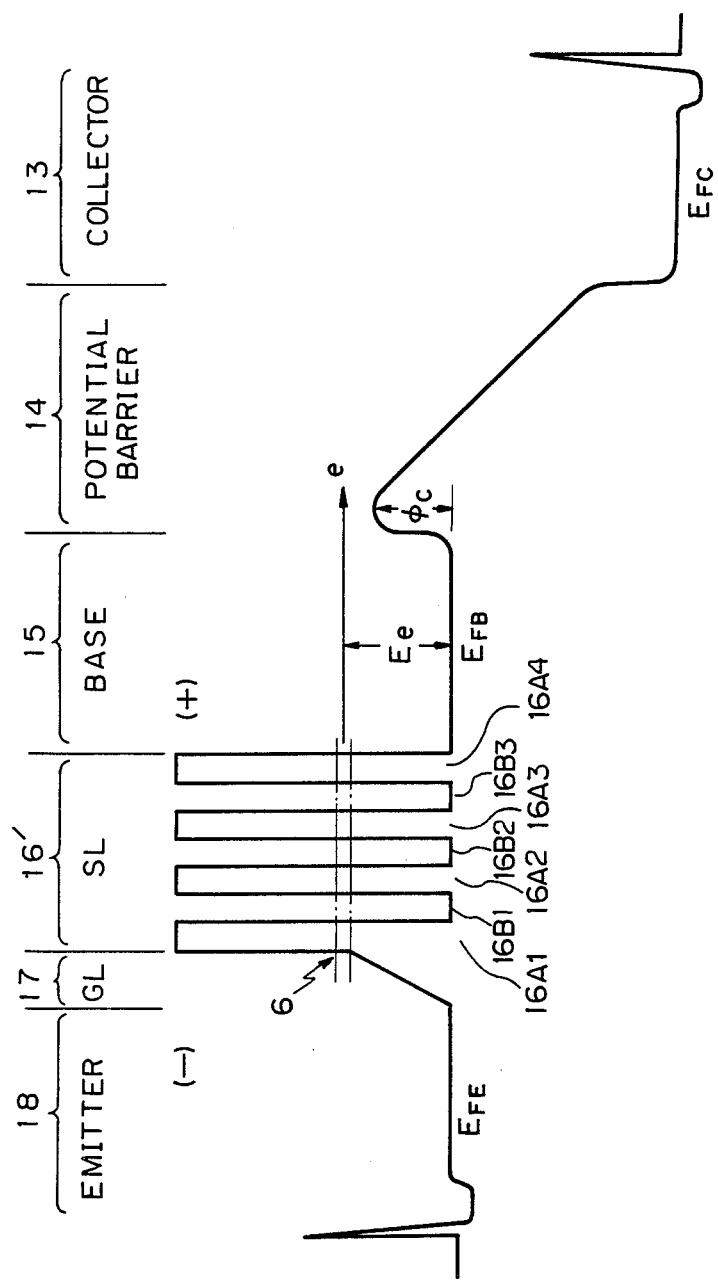
FIG. 12 is a conduction-energy-band diagram for the HET device shown in FIG. 11.

FIG. 11 is a sectional view of a further embodiment of an HET device in accordance with the present invention. FIG. 12 is a conduction-energy-band diagram of the HET device shown in FIG. 11.

The concept of provision of the graded layer 17 shown in FIG. 9 may be applied to the HET device including the superlattice 16' having the periodical structure as shown in FIG. 7, resulting in the HET device shown in FIG. 11 which features an improved current amplification factor.

An embodiment of a resonant tunneling type HET device will be explained referring to FIGS. 13 to 19.

Figure 13:
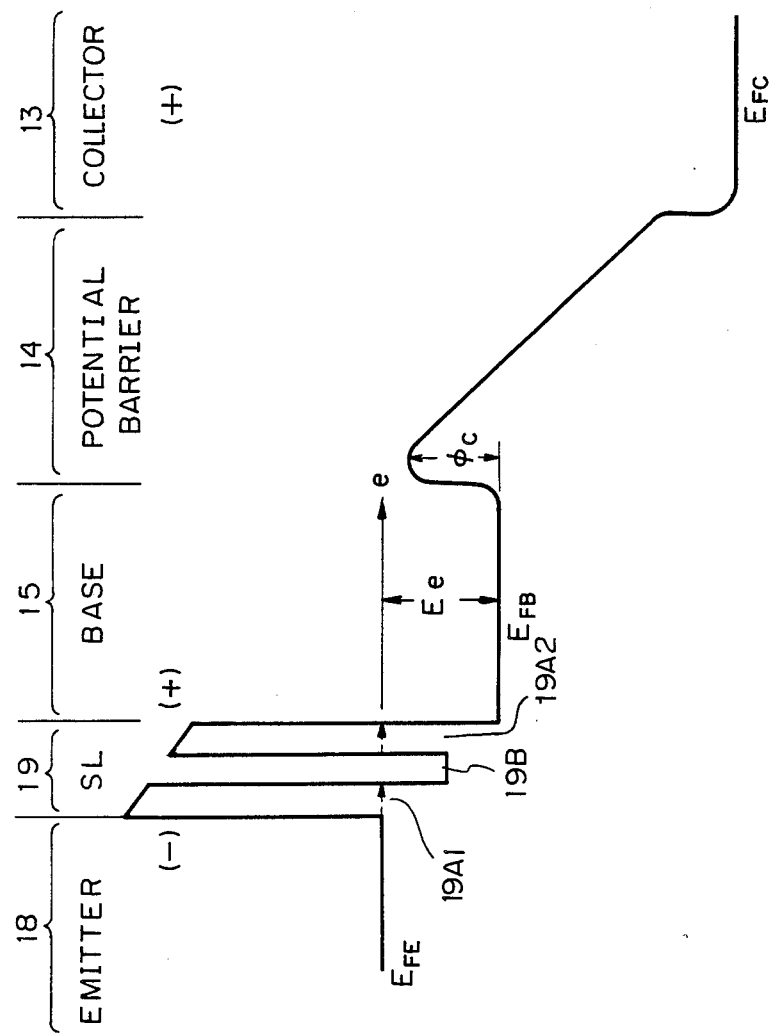
FIG. 13 is a conduction-energy-band diagram for another embodiment of an HET device in accordance with the present invention.

FIG. 13 shows a conduction-energy-band diagram of a resonant tunneling HET device. FIG. 13, depicts a superlattice 19 comprising non-doped impurity AlAs layers 19A1 and 19A2 and a non-doped impurity GaAs layer 19B formed similarly to layers 16A1, 16A2, and 16B in FIGS. 4 and 5. This corresponds to the superlattice 16 in FIGS. 4 and 5.

FIGS. 14a to 14c show schematically how resonance occurs with an applied DC bias voltage. Electrons originating near the Fermi-level $E_F$, to the left side of the first barrier 19A1 of height $\Delta E$, tunnel into the quantum well 19B, and finally tunnel through the second barrier 19A2 into unoccupied states. Resonance occurs when the electron wave function reflected at the first barrier is cancelled by the wave which is reflected from the second barrier or, equivalently, when the energy of the injected carrier becomes approximately equal to the energy level of the electrons confined in the quantum well.

Figure 15:
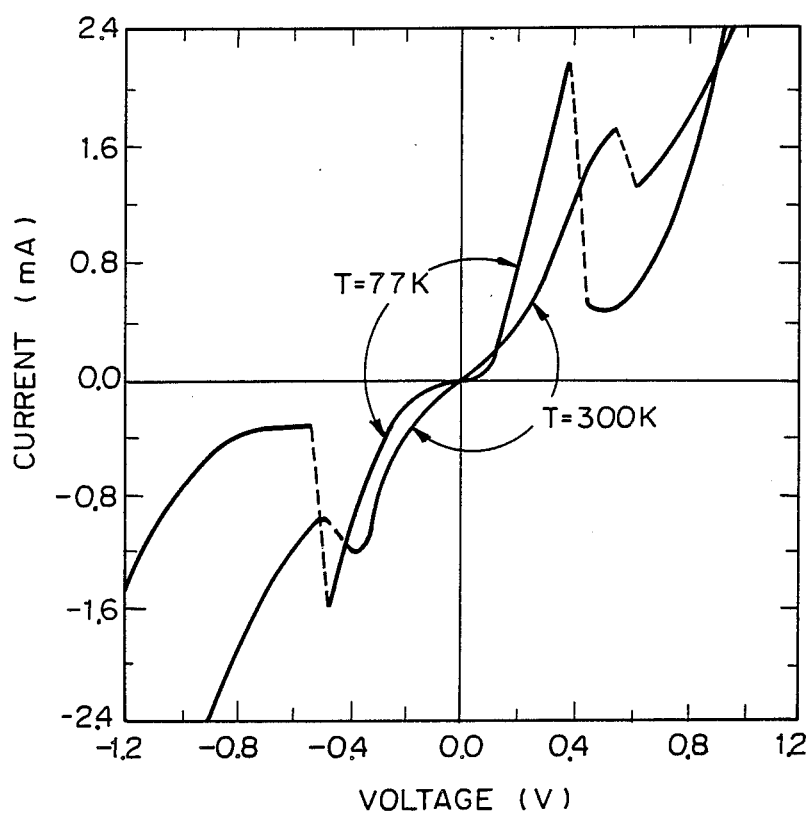
FIG. 15 is a graph showing current-voltage curves for a resonant tunneling structure shown in FIGS. 14a to 14c.

FIG. 15 is a graph showing current-voltage curves for the resonant tunneling structure depicted in FIGS. 14a to 14c. With the above resonant tunneling phenomenon, a negative resistance having an "n" shape can be observed in the first quadrant of the graph in FIG. 15.

Figure 16:
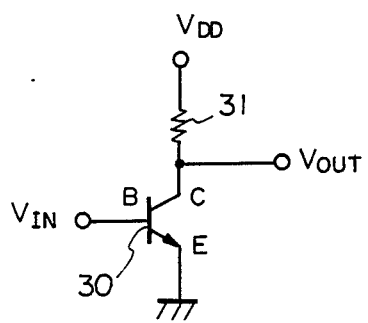
FIG. 16 is a circuit diagram showing an application of the resonant-tunneling HET device shown in FIG. 13.
Figure 17:
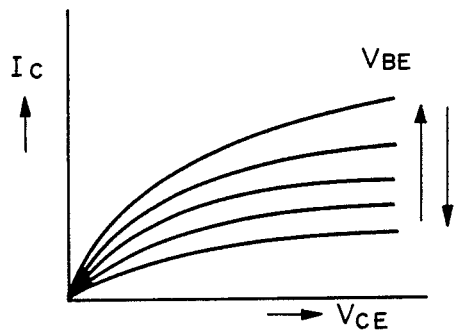
FIG. 17 is a graph showing characteristic curves of a collector current $I_C$ and collector-emitter voltage $V_{CE}$.
Figure 18:
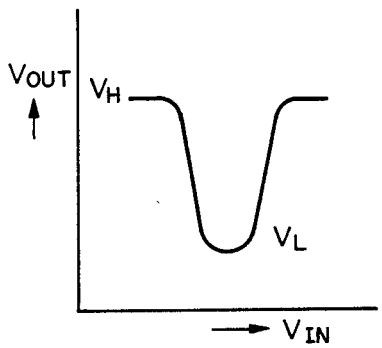
FIG. 18 is a graph showing characteristic curves of an input voltage $V_{IN}$ and an output voltage $V_{OUT}$ of the transistor shown in FIG. 16.

FIG. 16 is a circuit diagram showing an application of the resonant tunneling HET device depicted in FIG. 13. In FIG. 16, a resonant tunneling HET device 30 has an emitter E which is grounded and a collector C connected to a resistor 31.

by applying a suitable level of voltage $V_{CE}$ to the collector C through the resistor 31, while increasing the voltage $V_{BE}$ between a base B and the emitter E, i.e., an input voltage $V_{IN}$, first, the collector current $I_C$ is increased up to a predetermined value defined by the voltage $V_{CE}$. After passing a peak in the "n" shape resistance curve shown in FIG. 15, it is reduced. FIG. 17 shows this characteristic for the circuit in FIG. 16. Accordingly, as shown in FIG. 18, when the input voltage $V_{IN}$ is changed from low-level to high-level, an output voltage $V_{OUT}$ at the collector C is changed from a high-level $V_H$, to a low-level $V_L$, and again to a high-level $V_H$.

Figure 19A:
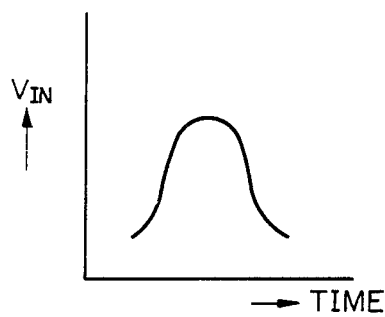
FIG. 19a and 19b are graphs for signal waveforms of the transistor in FIG. 16.
Figure 19B:
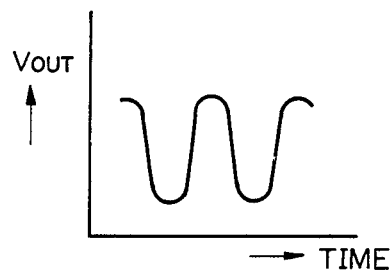

Then, when a pulse signal having predetermined gradients (slopes) over time, as shown in FIG. 19a, is applied as the input voltage $V_{IN}$ between the base B and the ground, two inverted pulses may be obtained as the output, as shown in FIG. 19b. This means that the resonant tunneling HET device acts as a frequency multiplier. The high-speed nature of the HET device is naturally maintained.

Figure 20A:
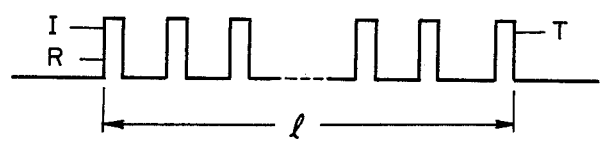
FIGS. 20a and 20b are views explaining a resonant tunneling phenomenon for multiquantum wells.
Figure 20B:
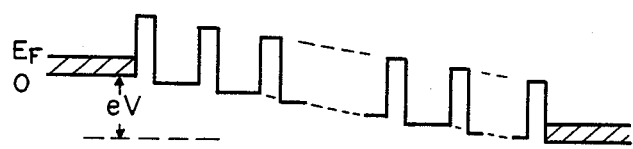
Figure 21:
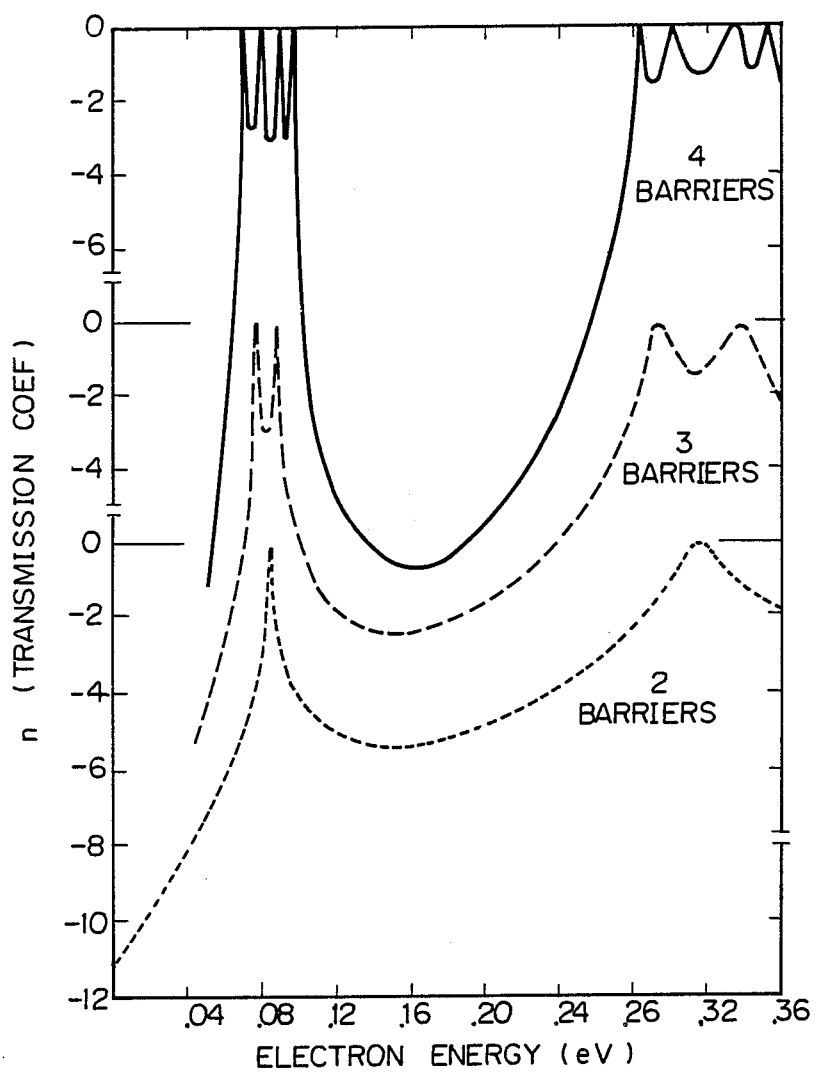
FIG. 21 is a graph showing electron energy and transmission coefficient characteristics for multiquantum wells.

When the periodical structure of the SL is increased as shown in FIG. 7, a plurality of quantum wells are formed therein, resulting in a plurality of resonance points as shwon in FIGS. 20a, 20b, and 21. Accordingly, the resonant tunneling HET device having an n-periodical structure superlattice may act as a $2^n$-frequency multiplier. multiplier, where n is equal to the number of barriers minus 1.

Many widely different embodiments of the present invention may be constructed without departing from the spirit and scope of the prevent invention. It should be understood that the present invention is not limited to the specific embodiments described in this specification, except as defined in the appended claims.

The HET device may be formed with any combination of the following materials:

A. Emitter layer 18:
   GaAs, $In_xGa_{1-x}As$ ($0 \leq x \leq 1$),
   $(In_xAs_{1-x})m(GaAs)n$ ($1 \leq m \lesssim 3$, $1 \leq n \lesssim 3$)

B. Superlattice 16:
   B1: barrier layer 16A
      $(Al_xGa_{1-x})As$, InP, $(In_xAl_{1-x})As$, insulator (i.g. $Al_2O_3$)
   B2: QW layer 16B
      GaAs, $(In_xGa_{1-x})As$ C. Base layer 15
   GaAs, $(In_xGa_{1-x})As$, $(In_xAs_{1-x})m(GaAs)n$, metal (e.g. Al)

D. Potential barrier layer 14
   $(Al_xGa_{1-x})As$, InP, $(In_xAl_{1-x})As$

E. Collector layer 13
   GaAs, $(In_xGa_{1-x})As$, $(InAs)m(GaAs)n$.

Furthermore, in the present invention, the base layer 15 can be a metal layer, e.g., aluminum. All the barrier layers 16A need not be the same material, that is, for the layers may vary the same barrier height.

In addition, any one of all of the barrier layers 16A can be an insulating layer, e.g., $Al_2O_3$.

The potential barrier can be formed by a Schottky barrier, which comprises a Schottky junction between a metal base layer Al and a semiconductor collector layer GaAs.

The base layer 15 can be a p-type doped layer.

The barrier layer 16A, quantum well layer 16B for the superlattice 16 does not have to be a non-doped semiconductor layer, but may be an n- or p-type doped semiconductor layer.

As the metal base type, preferably, the emitter, quantum well, and collector layers are GaAs, the barrier layers 16A are $Al_2O_3$, the base layer 15 is Al, and the potential barrier layer 14 is the Schottky junction.

I claim:

1. A high-speed semiconductor device, comprising:
   an emitter layer having a conduction band with a first energy level;
   a base layer formed under said emitter layer and having a conduction band with a second energy level;
   superlattice means, disposed between said emitter layer and said base layer, carriers tunneling therethrough, said superlattice means comprising:
   a first potential barrier layer forming a heterojunction with said emitter layer and having a conduction band with a third energy level, said third energy level being higher than said first energy level so that the conduction band of said emitter layer and the conduction band of said first potential barrier layer have a discontinuity therebetween;
   a quantum well layer forming a heterojunction with said first potential barrier layer and having a fourth conduction band with a fourth energy level, said fourth energy level being lower than said third energy level; and
   a second barrier layer forming a heterojunction with said quantum well layer and said base layer and having a conduction band with a fifth energy level, said fifth energy level being higher than said fourth and second energy levels;
   said first and second barrier layers having a thin thickness for tunneling carriers therethrough, and said quantum well layer having a thin thickness so as to have a sub-band therein;
   a collector semiconductor layer formed under said base layer; and
   a collector side potential-barrier means disposed between said base layer and said collector semiconductor layer.

2. A high-speed semiconductor device according to claim 1, wherein when a predetermined bias voltage is applied between said emitter layer and said base layer, the carriers in said emitter layer tunnel through said superlattice means via said sub-band in said quantum well layer and are injected into said base layer, the energy level of said injected carriers is higher than said second energy level.

3. A high-speed semiconductor device according to claim 1, wherein each of said first and second potential barrier layers and said quantum-well layer are formed with thicknesses of approximately 3~5 nm (30~50 Å).

4. A high-speed semiconductor device according to claim 1, wherein:
said superlattice means includes a plurality of quantum-well layer forming means which are stack-formed with a periodical structure; and
said superlattice means has at least one conduction minienergy band for tunneling the carriers therethrough.

5. A high-speed semiconductor device according to claim 1, wherein:
said emitter layer is formed of a material selected from the group consisting of GaAs, $In_xGA_{1-x}As$ ($0 \leq x < 1$), and $(In_xAs_{1-x})m(GaAs)n$ ($1 < m \lesssim 3$, $1 < n \lesssim 3$);
said first and second barrier layers of said superlattice means are formed of a material selected from the group consisting of $(Al_xGa_{1-x})As$, InP, $(In_xAl_{1-x})As$, and $Al_2O_3$;
said quantum well layer is formed of a material selected from the group consisting of GaAs, and $(In_xGA_{1-x})As$;
said base layer is formed of a material selected from the group consisting of GaAs, $(In_xGa_{1-x})As$, $(In_xAs_{1-x})m(GaAs)n$, and Al;
said potential barrier means is formed of a material selected from the group consisting of $(Al_xGA_{1-x})As$, InP, and $(In_xAl_{1-x})As$; and
said collector layer is formed of a material selected from the group consisting of GaAs, $(In_xGA_{1-x})As$, and $(InAs)_m(GaAs)_n$.

6. A high-speed semiconductor device according to claim 1, further comprising a graded layer, disposed between said emitter layer and said superlattice means, having a conduction band with a graded conduction-energy level which is approximately equal to the first energy level of said emitter layer at an interface of said emitter layer and said graded layer, and approximately equal to a predetermined energy level lower than said third energy level of said superlattice means at an interface of said superlattice means and said graded layer, to enable tunneling of the carriers therethrough, the carriers in said emitter layer being transported along said graded conduction-energy level in said graded layer, tunneling through said superlattice means via said sub-band in said quantum well layer, and injected into said base layer.

7. A high-speed semiconductor device according to claim 6, wherein said graded layer is formed of non-doped $Al_xGa_{1-x}As$ ($0.1 \lesssim x \lesssim 0.3$) and has a thickness of aproximately 10 nm (100 Å).

8. A high-speed semiconductor device according to claim 2, wherein:
when an input pulse signal having a predetermined voltage range, predetermined slope and a predetermined frequency is applied between said base layer and emitter layer, an output signal having a plural multiplied frequency of said predetermined input frequency is provided at said collector layer.

9. A high-speed semiconductor device according to claim 1, wherein said collector side potential-barrier means comprises a layer forming a heterojunction with said base layer and having a conduction band with a sixth energy level, said sixth energy level being higher than said second energy level,
wherein when a predetermined bias voltage is applied between said emitter layer and said base layer, the carriers in said emitter layer tunnel through said superlattice means via said sub-band in said quantum well layer and are injected into said base layer, and
wherein an energy difference between an energy level of said injected carriers in said base layer and said second energy level is lower than the energy difference between said sixth energy level and said second energy level.

10. A high-speed hot electron transistor (HET), comprising:
a collector semiconductor layer;
a collector side potential barrier layer formed on said collector semiconductor layer having a conduction band with an energy level higher than that of a conduction band of said collector semiconductor layer;
a base semiconductor or metal layer formed on said collector side potential barrier layer having a conduction band with an energy level lower than that of the conduction band of said collector side barrier layer;
superlattice means formed on said base layer, said superlattice means comprising:
a first potential barrier layer formed on said base layer having a conduction band with a higher energy level than that of the conduction band of the base layer, an energy level discontinuity being formed between said first potential layer and said base layer;
a quantum well layer formed on said first potential barrier layer having a conduction band; and
a second potential barrier layer formed on said quantum well layer having a conduction band with a higher energy level than that of the quantum well layer, said quantum well layer having so thin a thickness that a sub-band is provided therein; and
an emitter semiconductor layer formed on said second potential barrier layer having a conduction band with an energy level lower than that of the conduction band of the second potential barrier layer, and an energy level discontinuity being formed between said emitter layer and said second potential barrier layer.

11. A high-speed hot electron transistor (HET), comprising:
a semiconductor collector layer formed on a semiconductor substrate having a conduction band with an energy level;
a first potential barrier layer formed on said semiconductor collector layer having a conduction band with an energy level higher than that of the conduction band of said collector layer;
a base layer formed on said first potential barrier layer having a conduction band with an energy level lower than that of the conduction band of said first potential barrier layer;
superlattice means, formed on said base layer comprising:
a second potential barrier layer formed on said base layer having a conduction band with a higher energy level than that of the conduction band of said base layer, an energy level discontinuity being formed between said second potential barrier layer and said base layer;

a quantum well layer formed on said second potential barrier layer having a conduction band with an energy level; and a third potential barrier layer formed on said quantum well layer having a conduction band with a higher energy level than that of the conduction band of said quantum well layer, said quantum well layer having so thin thickness that a sub-band is provided therein;

a graded layer formed on said superlattice means, having a conduction band with a graded conduction-energy level; and an emitter layer formed on said third potential barrier layer having a conduction band with an energy level lower than that of the conduction band of said third potential barrier layer, and an energy level discontinuity being formed between said emitter layer and said third potential barrier layer.

12. An HET according to claim 11, wherein the graded conduction-energy level of said graded layer is approximately equal to the energy level of said emitter layer at an interface of said emitter layer and said graded layer, and approximately equal to a predetermined energy level lower than the energy level of said third potential barrier level at an interface of said superlattice means and said graded layer, to enable tunneling of carriers therethrough, carriers in said emitter layer being transported along said graded conduction-energy level in said graded layer, tunneling through said superlattice means via said sub-band in said quantum well layer, and injected into said base layer.

* * * * *

UNITED STATES PATENT AND TRADEMARK OFFICE
CERTIFICATE OF CORRECTION

PATENT NO. : 4,712,121

DATED : DECEMBER 8, 1987

INVENTOR(S) : NAOKI YOKOYAMA

It is certified that error appears in the above-identified patent and that said Letters Patent is hereby corrected as shown below:

FRONT PAGE [57] ABSTRACT, line 2, after "layer" (first and second occurrences) insert --,--.

Col. 2, line 13, "objections" should be --objectives--;
line 49, "FIG." should be --FIGS.--;
line 62, "FIG." should be --FIGS.--.

Col. 3, line 41, after "2" (first occurrence) insert --.--;
line 48, "layer e" should be --layer 3--.

Col. 4, line 11, "K." should be --K--;
line 42, "d: $5 \times 10_{17}$" should be --d: $5 \times 10^{17}$--;
line 45, "$(5 \times 10 \leq m^{-3})$" should be --$(5 \times 10^{23} m^{-3})$--.

Col. 5, line 17, after "therein" insert --.--;
line 34, after "In the" insert --present--;
line 49, "hog" should be --hot--;
line 55, delete "of".

Col. 6, line 26, after "layer is" insert --grounded and--;
line 27, "factor a" should be --factor $\gamma$--.

Col. 7, line 50, delete "multiplier." (first occurrence);
line 54, "prevent" should be --present--;
line 65, "(i.g.," should be --(e.g.--.

UNITED STATES PATENT AND TRADEMARK OFFICE
CERTIFICATE OF CORRECTION

PATENT NO. : 4,712,121

DATED : DECEMBER 8, 1987

INVENTOR(S) : NAOKI YOKOYAMA

It is certified that error appears in the above-identified patent and that said Letters Patent is hereby corrected as shown below:

```
Col. 8, line 10, delete "for the";
        line 11, delete "layers may vary";
        line 11, delete "same";
        line 11, after "height" insert --for the layers may
                 vary--;
        line 12, after "one of" insert --or--.

Col. 9, line 19, "<" (all occurrences) should be --≦--;
        line 20, "<" (all occurrences) should be --≦--.

Col. 11, line 10, after "thin" insert --a--.
```

Signed and Sealed this

Seventh Day of February, 1989

*Attest:*

DONALD J. QUIGG

*Attesting Officer*  *Commissioner of Patents and Trademarks*